Figure 1:
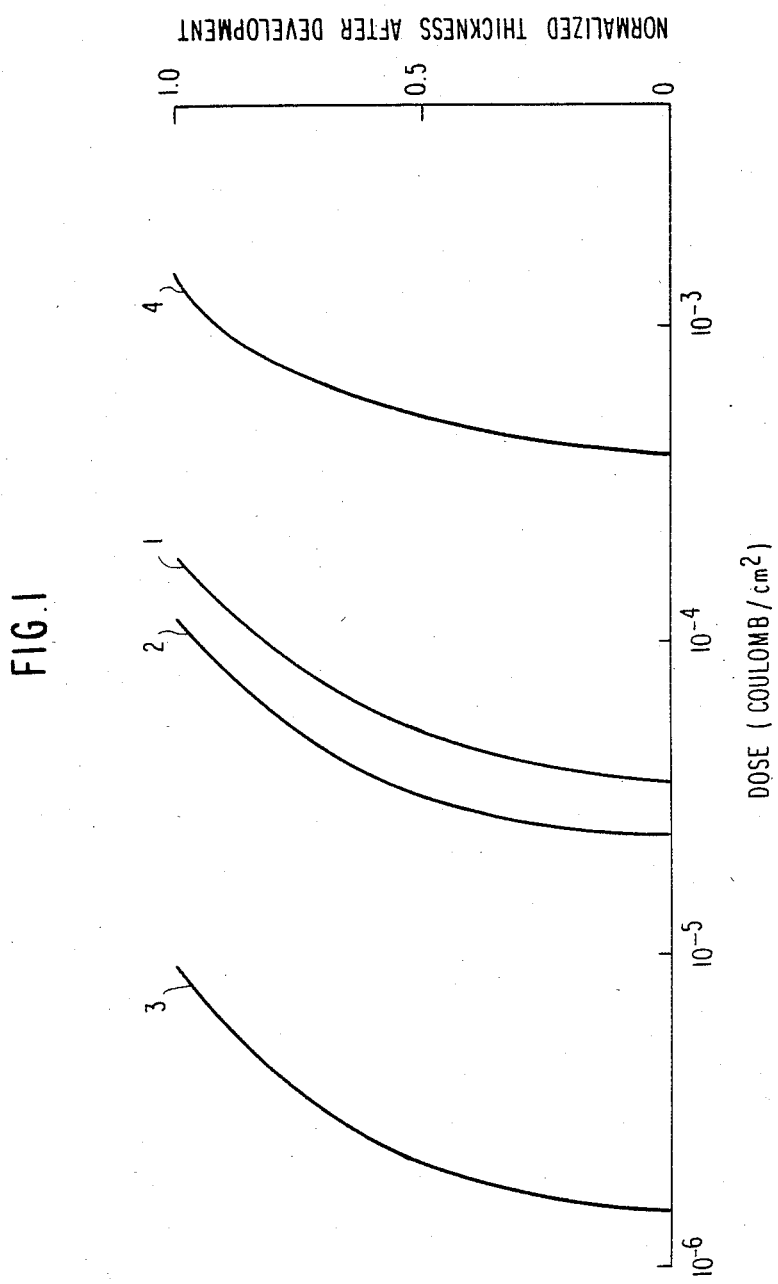

United States Patent [19]

Ohnishi et al.

[11] Patent Number: 4,592,993

[45] Date of Patent: Jun. 3, 1986

[54] PATTERN FORMING AND ETCHING PROCESS USING RADIATION SENSITIVE NEGATIVE RESIST

[75] Inventors: Yoshitake Ohnishi, Tokyo; Takeshi Endo, Kanagawa, both of Japan

[73] Assignee: Nippon Electric Co., Ltd., Tokyo, Japan

[21] Appl. No.: 787,695

[22] Filed: Oct. 15, 1985

Related U.S. Application Data

[63] Continuation of Ser. No. 527,622, Aug. 29, 1983, abandoned, which is a continuation of Ser. No. 317,819, Nov. 3, 1981, abandoned.

[30] Foreign Application Priority Data

Nov. 5, 1980 [JP] Japan ................................ 55-155351
May 25, 1981 [JP] Japan ................................ 56-78967
May 25, 1981 [JP] Japan ................................ 56-78968

[51] Int. Cl.$^4$ ............................................. G03C 5/00
[52] U.S. Cl. .................................... 430/313; 430/270; 430/310; 430/314; 430/325; 526/284
[58] Field of Search ............... 430/270, 281, 326, 310, 430/313, 314, 325; 204/159.22; 526/284

[56] References Cited

U.S. PATENT DOCUMENTS

| 3,162,532 | 12/1964 | Hoegl et al. | 96/1 |
| 3,164,575 | 1/1965 | Welch et al. | 260/93.5 |
| 3,817,957 | 6/1974 | Trepka | 260/83.7 |
| 4,208,211 | 6/1980 | Bowden et al. | 430/314 |

OTHER PUBLICATIONS

Imamura, J. Electrochem. Soc., vol. 126, No. 9, 9/1979, pp. 1628–1630.
Gokan et al., J. Electrochem. Soc., vol. 130, No. 1, 1/1983, pp. 143–146.
Thompson et al., J. Vac. Sci. Technol. 15(3), May/Jun. 1978, pp. 938–943.
Thompson et al., J. Electrochem. Soc., vol. 126, No. 10, pp. 1699–1702; 1703–1708, 10/1979.

Primary Examiner—Jack P. Brammer
Attorney, Agent, or Firm—Sughrue, Mion, Zinn, Macpeak, and Seas

[57] ABSTRACT

A process for fabrication of resist comprising a substrate and an overlying radiation sensitive layer, said overlying layer consisting essentially of a specific polymer or copolymer of vinylnaphthalene.

9 Claims, 2 Drawing Figures

PATTERN FORMING AND ETCHING PROCESS USING RADIATION SENSITIVE NEGATIVE RESIST

This is a continuation of application Ser. No. 527,622, filed 8/29/83, now abandoned, which is a continuation of application Ser. No. 317,819, filed 11/3/81, now abandoned.

The present invention relates to a process for fabrication of an article including a negative resist of the type which contains a polymer material sensitive to radiant rays (such as an electron beam, an X-ray, a γ-ray, and other short wavelength electromagnetic radiation), or corpuscular beams (such as an ion beam and a neutron beam).

Fine fabrication of integrated circuits, bubble memories and the like have customarily been done by the technique of photolithography in which a photosensitive material is subjected to light irradiation to form a desired resist pattern. However, since such a technique cannot give a favorable microfabrication accuracy on the order of the light wavelength, a finer pattern fabrication technique using a deep ultraviolet ray, an X-ray, an electron beam or like radiation has been recently developed for practical use.

As well known, resists are classified into two different types, i.e., a positive type and a negative type. A positive type resist becomes easily soluble in a solvent when subjected to irradiation; irradiated portions will be dissolved and removed by the subsequent development, while non-irradiated portions will remain unremoved to form a pattern. In contrast, a negative type resist becomes non-soluble or sparingly soluble in a solvent when irradiated; irradiated portions will remain unremoved after development to form a pattern with non-irradiated portions removed. Under the common conditions of irradiation, an image identical to the irradiation pattern or opposite thereto will be formed depending on the type of a resist used. Thus, it is advantageous to utilize resists of the two different types each in a situation suiting a specific purpose.

Among numerous positive resists sensitive to electron beams heretofore proposed, typical examples are poly(methyl methacrylate), poly(butene-1-sulfone), and poly(methyl isopropenyl ketone). Also, for electron-beam sensitive negative resists, poly(glycidyl methacrylate), copolymer of glycidyl methacrylate and ethyl acrylate, epoxidized polybutadiene, and poly(diallyl-o-phthalate) are well known.

Some of the resist materials mentioned above are now put in practical use to fabricate chromium masks by electron beam delineation. However, in the technological field of microfabrication, the dry etching process is currently employed in place of the wet etching process to provide a higher accuracy in etching a substrate. The dry process may be exemplified by ion milling, sputter etching or plasma etching. Such a trend is reflected by an increasing demand for resists which well withstand such dry etching process. Resists whose major application is to the fabrication of masks are required to be furnished with high sensitivity, resolution, and resistance to wet etching. To fabricate the chromium masks, for example, the resistance must be ensured to an aqueous solution of ceric ammonium nitrate which is an etching solution for chromium. However, their resistance in a dry etching process had been left out of consideration.

Study of the resistance of resists to the dry etching process proved that it can be markedly improved if a resist contains phenyl groups in its molecule. For one example, a positive resist available from Shipley Company under the trade name AZ resist which contains a number of phenyl groups, is known to be highly resistive to dry etching. Of all the known polymers containing numerous phenyl groups, polystyrene is admitted to be the greatest in the number of phenyl groups and, indeed, its resistance to dry etching has hitherto been understood to be the best. For this reason, as negative resists suitable for dry etching, there has been developed a polymer material containing styrene or its derivative (Japanese Patent Application Disclosure No. 155826/1979 corresponding to U.S. patent application Ser. No. 908791, filed May 23, 1978, now U.S. Pat. No. 4,208,211, issued on June 17, 1980 to Bowden et al) and chloromethylated polystyrene which is a polystyrene derivative (Japanese Patent Application Disclosure No. 11217/1980). Another polymer material containing styrene or a styrene derivative is disclosed in "Journal of Vacuum Science and Technology", Vol. 15, No. 3, pp 938–943 (1948), and "Journal of the Electrochemical Society", Vol. 126, No. 10, pp. 1699–1702 and pp. 1703–1708 (1979). Other examples of chloromethylated polystyrene are shown in detail in "Journal of the Electrochemical Society", Vol. 126, No. 9, pp. 1628–1630 (1979).

It is well known to etch a resist by a dry etching process which may employ a beam or shower of ions or plasma. This is employed to promote an anisotropic etching process, in place of a wet etching process which is isotropic, that ensures a desired precision in circuit fabrication. Also, it is employed in circuit fabrication to realize a maskless step in which delineation is applied directly to a substrate. Unless the resist which protects the substrate against the beam or shower in these applications is sufficiently resistive to dry etching, the bared and protected surface regions on the substrate would become indistinct from each other. Accordingly, the resistance should favorably be as large as possible so that a dry etching process can be performed with high accuracy.

It is an object of the present invention to provide a process for fabrication of an article including a radiation-sensitive negative resist consisting of a polymer material which contains vinylnaphthalene with higher resistance to dry etching than that of polystyrene, which has been taken as an organic resist highest in resistance to dry etching.

It is another object of the present invention to provide a process for fabrication of an article including a radiation-sensitive negative resist with excellent resolution for microfabrication and sensitivity suitable for electron beams and resolution suitable for microfabrication.

The polymer material may comprise a homopolymer of vinylnaphthalene, a derivative from polyvinylnaphthalene, e.g., chloromethylated polyvinylnaphthalene, a copolymer of vinylnaphthalene and another monomer, e.g., a copolymer of vinylnaphthalene and chloromethyl styrene. It will be apparent that substances derived from homopolymers of vinylnaphthalene such as chloromethylated polyvinylnaphthalene previously mentioned are similar in structure to copolymers of chloromethyl vinylnaphthalene and vinylnaphthalene. Concerning a copolymer of vinylnaphthalene and another monomer, a preferred vinylnaphtalene moisty is equal to or greater than 50% in terms of monomeric unit ratio, to keep the excellent resistance to dry etching.

If the molecular weight of the polymer were less than 10,000, the resultant sensitivity would be poor. If it were more than 1,000,000, swelling would occur during development to degrade resolution.

It is known that resolution grows higher as the polydispersivity ($M_w/M_n$ where $M_w$ denotes weight average molecular weight and $M_n$ number average molecular weight) decreases. Thus, the polydispersivity should preferably be as approximate as possible to the monodispersivity ($M_w/M_n=1$). Meanwhile, the resolution of a resist itself might be deteriorated in the event of development. It is preferred therefore to use a solvent which can dissolve and remove non-irradiated portions of the resist without causing the irradiated portions of the resist to swell. This is particularly true for those polymers which have large molecular weights within the specific range defined as above.

Thus, a molecular weight and a copolymerization ratio can be chosen suitably in accordance with a desired sensitivity and process characteristics.

A negative resist proposed by the present invention has resistance to dry etching which is far higher than that of all the organic resists known in the art. Use of such a material in the fabrication of semiconductors, integrated circuits or the like will ensure a safe etching step.

Another outstanding contribution of the improved resistance to dry etching consists in substantially improving the resolution. A resist according to the invention needs a minimum of thickness on a substrate due to the improved etching resistance. As well known in the art, a thick resist film on a substrate degrades the resolution when subjected to electron beam irradiation, for example, because electrons driven into the resist will be scattered in all directions therein.

Figure 2:
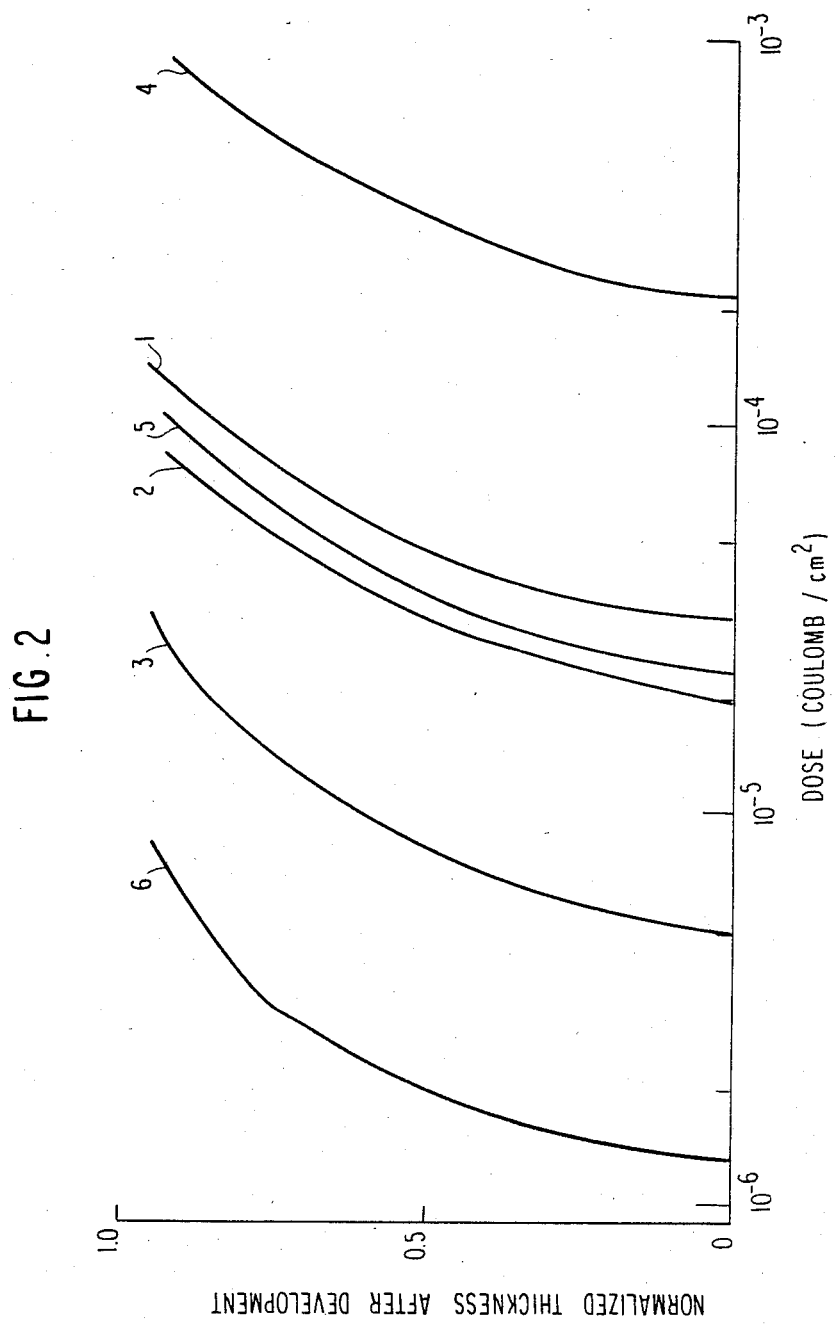

The present invention will become apparent by referring to the accompany drawings in which:

FIG. 1 shows sensitivity curves of resists used in the present invention to electron beam irradiation; and FIG. 2 also shows sensitivity curves of other resists used in the present invention to electron beam irradiation.

According to one aspect of the present invention, there is provided a pattern forming and etching process for use in microfabrication processes, said process comprising the steps of:

(1) selectively exposing an article comprising a substrate and an overlying radiation sensitive layer consisting essentially of a polymeric material to radiation to form a pattern in which the ease of removal of the irradiated portions of said overlying layer by a developing agent is decreased;

(2) treating said overlying layer with developing agent to selectively remove the unexposed portions thereof; and (3) dry etching the article with etching gases whereby the regions of said article surface corresponding to the removed portions of the patterned overlying layer are preferentially etched;

characterized in that said polymeric material consists of a polymer which contains at least 50 percent by monomeric unit ratio of one or a combination of monomeric units selected from the group of:

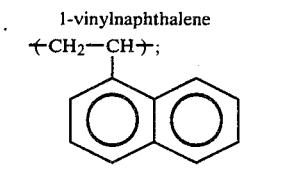

1-vinylnaphthalene

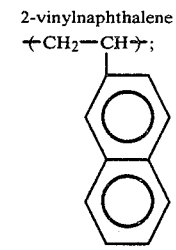

2-vinylnaphthalene

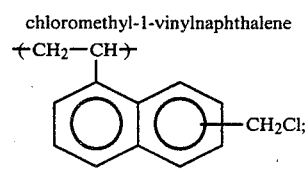

chloromethyl-1-vinylnaphthalene and,

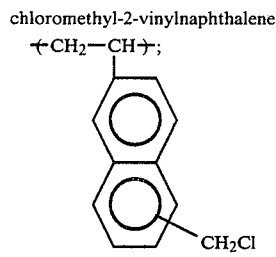

chloromethyl-2-vinylnaphthalene wherein said polymer has a weight average molecular weight $M_w$ within the range of 10,000 to 1,000,000 and wherein the polydispersivity of said polymer $M_w/M_n$, wherein $M_n$ is number average molecular weight, is less than 5.

EXAMPLE 1

Poly-2-vinylnaphthalene (P2VN) provided by bulk polymerization was subjected to fractional precipitation to prepare a sample with dioxane employed as a solvent and ethanol as a non-solvent. A molecular weight distribution of the sample was measured by gel permeation chromatography.

A resist solution was prepared by dissolving in dioxane 10 weight percent of the sample whose weight average molecular weight was 120,000 and polydispersivity was 1.6. The resist solution was spin-coated at 2,500 rpm (revolutions per minute) onto a substrate followed by prebaking at 100° C. (degrees centigrade) for 30 minutes to obtain a uniform film of about 0.7 micron in thickness. Then, various kinds of pattern delineation were applied using an electron beam exposure system (available from Japan Electron Optics Laboratory under the trade name JBX-5A) at an acceleration voltage of 20 KV (kilovolts) and with different doses. After the exposure, the substrate was taken out from the exposure system and dipped for 60 seconds in a liquid containing 4 parts of tetrahydrofuran and 1 part of ethanol for development, and was rinsed in a liquid containing 1 part of methyl ethyl ketone and 1 part of ethanol for 30 seconds to obtain resist patterns on the substrate. After drying, film thicknesses were measured by a product available from Rank Taylor Hobson under the trade name Taly step to determine the relationship between the residual film thickness and the dose. The measurement resulted a sensitivity curve 1 shown in FIG. 1. A dose ($D_g^{0.5}$) providing a residual film thickness which is one half of the original, which implies practical sensitivity, was measured to be $5.0 \times 10^{-5}$ C/cm$^2$ (coulombs per square centimeter). In FIG. 1, the abscissa indicates the dose and the ordinate the film thickness after development which was normalized by the thickness before development.

EXAMPLE 2

P2VN was prepared in the same way as in Example 1 except that the sample had an average molecular weight of 190,000. A resist solution was prepared by dissolving the sample in xylene by 3 weight percent. The solution was spin-coated onto a substrate at 2,500 rpm and pre-baked at 100° C. for 30 minutes to obtain a uniform film of about 0.3 micron.

Evaluation test was performed on the sample employing the same procedure as in Example 1. The sensitivity of the resist was measured to be $D_g^{0.5} = 3.2 \times 10^{-5}$ C/cm$^2$. This is represented by a sensitivity curve 2 in FIG. 1.

EXAMPLE 3

Poly-1-vinylnaphthalene (P1VN) prepared by radical polymerization was allowed for evaluation as in Example 1. The sample had a weight average molecular weight of 20,000 and showed a sensitivity of $D_g^{0.5} = 5.2 \times 10^{-4}$ C/cm$^2$ which is somewhat lower than that for P2VN.

We measured etching rates for the materials prepared by Examples 1–3 of the present invention and prior art resists having low etching rates. The results will be indicated in Tables 1 and 2.

The etching rates indicated in Table 1 are average etching rates measured by etching the materials each for 10 minutes at $2 \times 10^{-4}$ Torr employing an instrument under the trade name three-inch Microetch system available from Veeco Company.

TABLE 1

Etching rates for various resist materials under an Ar ion milling etching technique:

(500 eV (electron volts), normal incidence 0.83 mA (milliampere)/cm$^2$)

| MATERIALS | ETCHING RATES |
|---|---|
| PMMA | 400 Å min (angstroms per minute) |
| PMIPK | 280 |
| AZ-1350J | 190 |
| PS | 220 |
| P1VN | 160 |
| P2VN | 150 |

A product available from E. I. du Pont de Nemours & Company under the trade name Elvacite 2041 was used as PMMA (poly methyl methacrylate); and a product from Shipley Company under the trade name AZ-1350J, as a positive resist material. Also, a product available from Tokyo Ohka Kogyo Company was used as PM1PK (poly isopropenyl ketone); and a product from Pressure chemical Company, as PS (polystyrene).

While polystyrene has been known as an organic polymer resist whose etching rate is considerably low, the materials P1VN and P2VN show etching rates for lower than that of polystyrene, that is, about two-thirds of polystyrene, as will be seen from Table 1.

Table 2 represents etching rates for conventional AZ and PS and those for P2VN under several etching techniques.

It will be seen from Table 2 that P2VN again showed an excellent resistance to etching as represented by Table 1 as well.

Molecular weights of the materials have no significant influence on the etching rates. Polystyrene, for example, undergoes a variation in etching rate which is as little as several percent or less for molecular weights of 3,000 up to 1 million.

TABLE 2

| ETCHING TECHNIQUES | | |
|---|---|---|
| CCl$_4$ | CCl$_3$F/O$_2$ | O$_2$ milling |
| 132SCCM (standard cubic centimeters) | 40/5SCCM | |
| 0.3 Torr | 0.04 Torr | 500 eV |
| RF (radio frequency) | 150 W (watts) | 1.0 mA/cm$^2$ |
| 1.5 (amperes) | | |
| MATERIALS | ETCHING RATES (Å/min) | |
| AZ | 480 | 810 | 2100 |
| PS | 270 | 630 | 1750 |
| P2VN | 190 | 550 | 1600 |

A suitable method for the synthesis of P2VN is ordinary radical polymerization when the melecular weight is less than 100,000, bulk polymerization when it is of the order of 100,000–300,000 or emulsion polymerization when it is more than 500,000. Though P1VN and P2VN are commercially available as reagents, they are not usable as resists unless refined. Synthetic methods of P2VN are well known, and for example, for details of the radical polymerization, reference is made to U.S. Pat. No. 1,982,676.

EXAMPLE 4

P2VN prepared in the same way as in Example 1 (average molecular weight = 120,000, polydispersivity = 1.6) was subjected to chloromethylation with chloromethyl ether by the Friedel-Crafts reaction. The resultant material was reprecipitated and then dried in vacuum. The product was allowed for elemental analysis to find 36% chloromethylation. This sample was evaluated as a resist by the same method as in Example 1. Its sensitivity was measured to be $D_g^{0.5} = 2.2 \times 10^{-6}$ C/cm$^2$. The sensitivity is represented by a curve 3 in FIG. 1.

As previously stated in connection with the background of the invention, chloromethylation can be adopted for polystyrene for the purpose of increasing the sensitivity of a resist. However, chloromethylation of P2VN proceeds far faster than polystyrene and might cause gelling of the material if performed carelessly. Thus, one must be precautious enough to avoid this such as by diluting the solution to a sufficient degree.

Examples 5–10 which will be described hereinafter are concerned with copolymers.

EXAMPLE 5

A copolymer of chloromethyl styrene and 2-vinyl-naphthalene is readily obtainable by ordinary radical polymerization. For example, a monomeric mixture containing 0.01 mole 2-vinylnaphthalene and 0.02 mole chloromethyl styrene (consisting of 60% m-chloromethyl and 40% p-chlorostyrene) was added with AIBN (azobisisobutylonitrile) of 1 mole percent to the monomer concentration as an initiator. The mixture was dissolved in 20 milliliters of refined benzene. The mixture solution was poured in a polymerizing tube, freeze-deaerated and polymerized in the sealed tube at 70° C. for 24 hours. The solution was then introduced into 100 milliliters of methanol to separate a polymer. The polymer was purified by reprecipation, using methylene chloride, and methanol as solvent and non-solvent, respectively. After being repeatedly subjected to such a refining process three times, the polymers were dried under reduced pressure. A copolymerization ratio was determined from the elemental analysis of the resultant polymers (chlorine content).

Eight weight percent of the resultant copolymer (21.8% chloromethyl styrene, 78.2% 2-vinylnaphthalene, weight average molecular weight=18,600, polydispersivity=1.6) was dissolved in xylene and filtered through a filter of a pore size of 0.2 micron to prepare a resist solution. This solution was spin-coated onto a substrate at 2000 rpm and prebaked at 100° C. for 30 minute to obtain a uniform 0.9 micron thick film on the substrate. Using an electron beam exposure system (available from Japan Electron Optics Laboratory under the trade name J BX-5A), various pattern delineations were applied to the resist at an acceleration voltage of 20 KV while varying the dose. After exposure, the substrate was taken out from the system and dipped in benzil acetate for 60 minutes for development followed by rinsing in isopropanol for 30 seconds to obtain resist patterns. After post-baking at 150° C. for 30 minutes, thicknesses of residual film were measured by the product available from Rank Taylor Hobson mentioned in Example 1. The resultant residual film thickness to dose relation is represented by a sensitivity curve 1 in FIG. 2. In FIG. 2, the abscissa indicates the dose and the ordinate, the film thickness after development normalized by the thickness before development. A dose ($D_g^{0.5}$) which reduces the initial film thickness to one half after development, which is a practical sensitivity of a resist, was $4.3 \times 10^{-5}$ C/cm$^2$. This sensitivity was about 16 times as high as those for homopolymers of P2VN of the same molecular weight. Even resist patterns as fine as less than 1 micron were found fully resolved.

EXAMPLE 6

10 weight percent of a copolymer (41.2% chloromethyl styrene, 58.8% 2-vinylnaphthalene, weight average molecular weight=21,000, polydispersivity=1.8) was dissolved in xylene and filtered through a 0.2 micron filter to obtain a resist solution. This resist solution was evaluated by the same method as in Example 5. The result is represented by a sensitivity curve 2 shown in FIG. 2. The sensitivity ($D_g^{0.5}$) was $3.1 \times 10^{-5}$ C/cm$^2$; it did not always increase in proportion to the amount of chloromethyl styrene.

EXAMPLE 7

Eight weight percent of a copolymer (17.5% chloromethyl styrene, 82.5% 2-vinylnaphthalene, weight average molecular weight 120,000, polydispersivity=2.0) was dissolved in xylene followed by filtering through a 0.2 micron filter to prepare a resist solution.

Evaluation of the resist solution by the same method as in Example 5 provided a sensitivity curve 3 shown in FIG. 2. In this case, the substrate was dipped in a mixture liquid containing 3 part of tetrahydrofuran and 1 part of ethanol for development for 60 seconds followed by rinsing in isopropanol.

The gel point dose was $5.0 \times 10^{-6}$ C/cm$^2$ while $D_g^{0.5}$ was $8 \times 10^{-4}$ C/cm$^2$. It was also the case with this Example that patterns less than 1 micron were sufficiently resolved.

EXAMPLE 8

A copolymer was produced from a 10:2 mixture of 2-vinylnaphthalene and p-chlorostyrene using the same radical copolymerization process as in Example 15. 10 weight percent of the copolymer (77.2% 2-vinylnaphthalene, 22.8% p-chlorostyrene, weight average molecular weight=22,000, polydispersivity=1.8) was dissolved in xylene. The solution was filtered through a 0.2 micron filter to prepare a resist solution. This solution was spin-coated onto a substrate at 2000 rpm and prebaked at 100° C. for 30 minutes to obtain a uniform film of about 0.2 micron in thickness. The same evaluation as in Example 5 was performed for this product to obtain a sensitivity curve 4 shown in FIG. 2. A dose ($D_g^{0.5}$) which provides a film of one half of the initial thickness was $3.5 \times 10^{-4}$ C/cm$^2$. The sensitivity was found to be twice the sensitivity for P2VN. Resist patterns less than 1 micron were fully resolved.

EXAMPLE 9

Eight weight percent of a copolymer (25.8% chlorostyrene, 74.2% 2-vinylnaphthalene, weight average molecular weight=220,000, polydispersivity=2.1) was dissolved in xylene and filtered through a 0.2 micron filter to prepare a resist solution.

The evaluation was performed as in Example 5. The sensitivity curve for the resultant resist is shown in FIG. 2. In this Example, the substrate was dipped for 60 seconds in a liquid containing 3 part of tetrahydrofuran and 1 part of methyl ethyl ketone for development followed by rinsing in a liquid 1 part of methyl ethyl ketone and 2 part of ethanol for 30 seconds. A gel point dose ($D_g^i$) was $2.3 \times 10^{-5}$ C/cm$^2$ while $D(_g^{0.5})$ was $3.6 \times 10^{-5}$ C/cm$^2$.

EXAMPLE 10

A copolymer of 2-vinylnaphthalene and glycidyl methacrylate provided by radical copolymerization was allowed for evaluation as a resist. The monomeric unit ratio between 2-vinylnaphthalene and glycidyl methacrylate ratio was determined to be about 85:15 by elemental analysis and infrared absorption spectrum, although the monomer ratio of charge was to be 50:50. The weight average molecular weight was 260,000 and the polydispersivity 1.9, as measured by gel permeation chromatography.

The copolymer was irradiated by an electron beam as in Example 1 to obtain a sensitivity ($D_g^{0.5}$)=$2.6 \times 10^{-6}$ C/cm$^2$. A sensitivity curve representing this case is indicated by the reference numeral 6 in FIG. 2.

Of the Examples described hereinabove, Examples 4 and 5 to 10 indicated examples of chloromethylated compounds of P2VN and copolymers containing 2-vinylnaphthalene. What is of utmost concern here is whether such materials are poorer in etching resistance than homopolymers of 2-vinylnaphthalene. Measurement of etching rates under an Ar ion milling etching technique as stated in connection with Table 1 proved that the etching rate increases by the order of 20% compared to P2VN when about 20% chloromethyl styrene, chorostyrene or glycidyl methacrylate is copolymerized with the materials concerned. Chloromethylation is also effective to increase the etching rate though insignificant (10 to 20%). In any case, however, etching rates obtainable with such materials are lower than that of polystyrene.

Since polystyrene or P2VN is a low sensitivity material, a little sacrifice of etching resistance is unavoidable when it is desired to use such a material with an increased sensitivity. Compared to chloromethylated polystyrene, however, chloromethylated P2VN or poly(chloromethyl styrene-CO-2-vinylnaphtalene) was proved to have an etching rate of two thirds of that for chloromethyl polystyrene. For example, under the Ar ion milling condition as described in Example 3, etching rates for polystyrene, chloromethylated polystyrene, P2VN, chloromethylated P2VN, and poly(chlorometyl styrene-CO-2-vinylnaphtalene) were measured to be 220, 260, 150, 180, and 185 A/min, respectively. To have the etching rate of two-thirds implies that the thickness of a resist film employed in a dry etching step may be two-thirds. As already mentioned, a thick resist film deteriorates the resolution in electron beam irradiation due to scattering of the electrons. In other words, the thinner the film is, the higher the resolution grows. All the materials provided by Examples 1-10 can resolve patterns less than 1 micron relatively easily for an initial film thickness range of 0.6 to 0.8 micron. If the initial film thickness is reduced to about 0.3 micron a resolution less than 0.5 micron will be achieved with ease.

Another factor on which the resulution depends is proper selection of a developer. While xylene or dioxane is favorable as a solvent, it is unfavorable as a developer because it would cause patterns to swell noticeably. Benzyl acetate, tetrahydrofuran and their mixtures with non-solvents as indicated in Examples constitute desirable developers. Choice of an optimum developer is also dependent upon the molecular weight of polymer and, thus, optimum conditions need be determined for each specific case.

It will be seen that one can choose any material optimum for a specific application in accordance with the conditions discussed hereinabove. In detail, the homopolymer, or P2VN, is desirable when a negative resist of the greatest resistance to dry etching is needed. For a negative resist highly sensitive while maintaining relatively great etching resistance, a desirable material will be a chloromethylated compound of P2VN. To increase the sensitivity, the molecular weight of a material used should be as large as possible in view of the fact that the weight average molecular weight $M_w$ and necessary dose for patterning are inversely proportional to each other. However, materials of large molecular weights swell during development and thereby deteriorate the resolution. It follows that materials of small molecular weights must be employed if resolution has priority to the other factors.

Various modifications will become possible for those skilled in the art from the above Examples without departing from the scope of the invention.

What is claimed is:

1. A pattern forming and etching process for use in microfabrication processes, said pattern and etching process comprising the steps of (A) selectively exposing an article comprising a substrate and an overlying radiation sensitive layer consisting essentially of a polymeric material to radiation to form a pattern in which the ease of removal of the irradiated portions of said overlying layer by a developing agent is decreased;

(B) treating said overlying layer with said developing agent to selectively remove the unexposed portions thereof; and (C) dry etching the article with etching gases whereby said article surface corresponding to the removed portions of the patterned overlying layer are preferentially etched; characterized in that said polymeric material consists of a polymer which contains at least 50 percent by monomeric unit ratio of one or a combination of monomeric units selected from the group of:

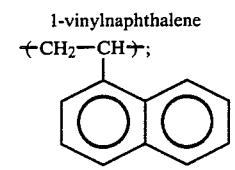

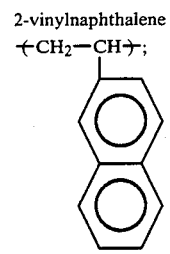

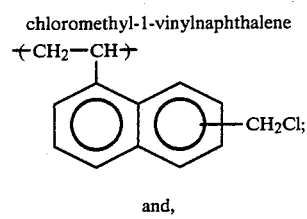

and,

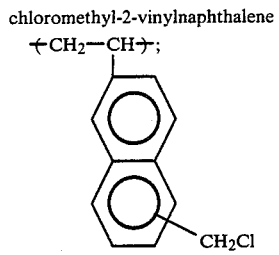

wherein said polymer has a weight average molecular weight $M_w$ within the range of 10,000 to 1,000,000 and wherein the polydispersivity of said polymer $M_w/M_n$, wherein $M_n$ is number average molecular weight, is less than 5.

2. A process as claimed in claim 1, wherein the polymer comprises poly-2-vinylnaphthalene.

3. A process as claimed in claim 1, wherein the polymer comprises chloromethylated poly-2-vinylnaphthalene.

4. A process as claimed in claim 1, wherein the polymer comprises a copolymer of vinylnaphthalene and chloromethyl styrene.

5. A process as claimed in claim 1, wherein the polymer comprises a copolymer of vinylnaphthalene and chlorostyrene.

6. A process as claimed in claim 1, wherein the polymer comprises a copolymer of vinylnaphthalene and glycidyl methacrylate.

7. A process as claimed in claim 5 or 6 wherein the moiety of said vinylnaphthalene is equal to or greater than 50 percent in terms of monomeric unit ratio.

8. A process as claimed in claim 1, wherein the polydispersivity of the polymer $M_w/M_n$ ($M_w/M_n$ where $M_w$ denotes a weight average molecular weight; and $M_n$, a number average molecular weight) is preferably less than 3.

9. A process as claimed in claim 4 wherein the moiety of said vinylnaphthalene is greater than about 80 percent in terms of monomeric unit ratio.

* * * * *

UNITED STATES PATENT AND TRADEMARK OFFICE
CERTIFICATE OF CORRECTION

PATENT NO. : 4,592,993

DATED : June 3, 1986

INVENTOR(S) : Ohnishi, Yoshitake; Tokyo; and Endo, Takeshi; Kanagawa, JAPAN

It is certified that error appears in the above-identified patent and that said Letters Patent is hereby corrected as shown below:

Column 2, line 23, after "-943" delete "(1948)" and insert therefor --(1978)--.

Signed and Sealed this

Seventeenth Day of February, 1987

Attest:

DONALD J. QUIGG

Attesting Officer     Commissioner of Patents and Trademarks